United States Patent
Ohtani et al.

(12)
(10) Patent No.: US 6,170,069 B1
(45) Date of Patent: Jan. 2, 2001

(54) BIT ERROR MEASURING DEVICE FOR MODEM DEVICE AND BIT ERROR MEASURING METHOD FOR THE SAME

(75) Inventors: Morito Ohtani; Takao Suzuki, both of Tokyo (JP)

(73) Assignee: Ando Electric Co., Ltd., Tokyo (JP)

( * ) Notice: Under 35 U.S.C. 154(b), the term of this patent shall be extended for 0 days.

(21) Appl. No.: 09/198,249

(22) Filed: Nov. 24, 1998

(30) Foreign Application Priority Data

Nov. 26, 1997 (JP) .................................................... 9-324894

(51) Int. Cl.[7] ...................................................... G06F 11/00
(52) U.S. Cl. ............................ 714/704; 714/738; 714/744
(58) Field of Search .................................. 714/738, 744, 714/724, 704

(56) References Cited

U.S. PATENT DOCUMENTS 4,555,663 * 11/1985 Shimizu ................................ 714/738
5,623,497 * 4/1997 Shimawaki et al. .................. 714/704

* cited by examiner

Primary Examiner—Phung M. Chung
(74) Attorney, Agent, or Firm—Pillsbury Madison & Sutro LLP

(57) ABSTRACT

A bit error measuring device for modem device, comprises; a control code detecting unit for detecting a flow control code set in an input signal from the modem device, and for masking the flow control code, a bit error measuring unit for measuring bit errors in the input signal of which the flow control code is masked, a clock controlling unit for controlling an output of a clock signal by the flow control code, and a test pattern transmitting unit for transmitting a test pattern signal by synchronizing with the clock signal when clock pulses of the clock signal are outputted from the clock signal controlling unit, and for stopping a transmission of the test pattern signal when the clock pulses of the clock signal are not outputted from the clock signal controlling unit.

8 Claims, 5 Drawing Sheets

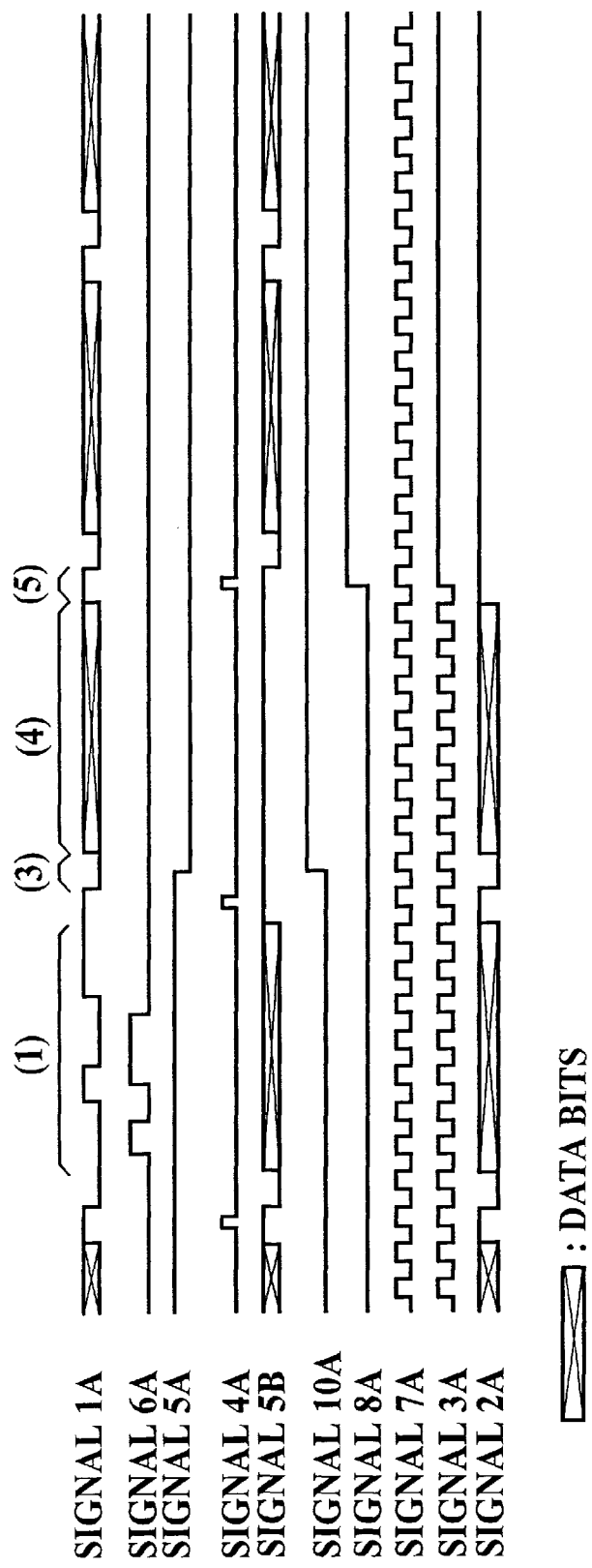

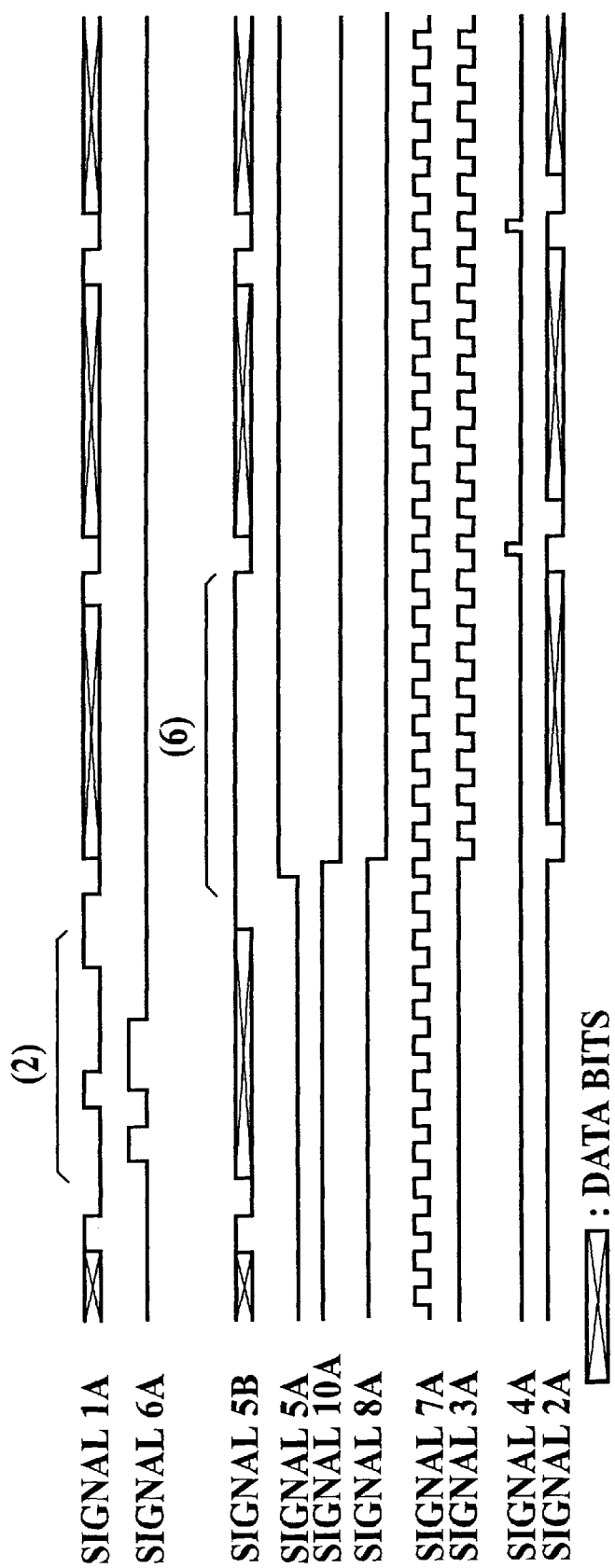

BIT ERROR MEASURING DEVICE FOR MODEM DEVICE AND BIT ERROR MEASURING METHOD FOR THE SAME

BACKGROUND OF THE INVENTION

1. Field of the Invention

The present invention relates to a bit error measuring device for a modem device and a bit error measuring method for the same, which can detect a flow control code outputted from a modem device connected with a data processing device through a connector, for example, an RS-232-C connector standardized by Electronic Industries Association, and which can control a transmission of a test pattern and can mask the flow control code, when a bit error measurement is carried out.

2. Description of the Related Art

FIG. 4 shows a construction of a typical bit error measuring device for a modem device, which is connected with a data processing device, such as a personal computer, through an RS-232-C connector. The construction of the bit error measuring device will be explained. In FIG. 4, the bit error measuring device comprises a bit error measuring circuit 21, a test pattern transmitting circuit 22 and a clock controlling circuit 23.

The bit error measuring circuit 21 measures (or detects) a bit error in an input signal 21A outputted from a modem device (not shown in the figure), which is a pseudo-random pattern recommended by International Telecommunications Union-Telecommunication (hereinafter, referred to as to ITU-T). The test pattern transmitting circuit 22 outputs a test pattern signal 22A which is a random code recommended by ITU-T, to the outside of the bit error measuring device by synchronizing it with a test pattern synchronizing clock signal 23A outputted from the clock controlling circuit 23. As shown in FIG. 5, the clock controlling circuit 23 divides a basic clock signal by using a dividing circuit 25 and generates the test pattern synchronizing clock signal 23A to output it to the test pattern transmitting circuit 22.

According to the bit error measuring device as shown in FIG. 4, the test pattern transmitting circuit 22 outputs a test pattern signal 22A to the outside of the bit error measuring device by synchronizing it with a test pattern synchronizing clock signal 23A outputted from the clock controlling circuit 23. However, because a flow control code outputted from a modem device cannot be detected, there is a problem that a control of stopping or retransmitting the test pattern signal cannot be carried out in accordance with the flow control code.

SUMMARY OF THE INVENTION

The present invention was developed in view of these problems.

An object of the present invention is to provide a bit error measuring device for a modem device or a bit error measuring method for the same, which can detect a flow control code outputted from the modem device, for example, a D3 code (a test patternstopping requestcode), a D1 code (a test pattern transmitting request code) or the like, and which can control a transmission of a test pattern and can mask the flow control code, when a bit error measurement is carried out.

That is, in accordance with one aspect of the present invention, the bit error measuring device for modem device, for measuring bit errors when a flow control operation is carried out, comprises;

a control code detecting unit for outputting a control code detecting signal by detecting a flow control code set in an input signal inputted thereinto from the modem device, and for masking the flow control code set in the input signal and outputting the input signal of which the flow control code is masked, a bit error measuring unit for measuring bit errors in the input signal of which the flow control code is masked, a clock controlling unit for outputting a test pattern synchronizing clock signal to a test pattern transmitting unit, the test pattern transmitting unit for transmitting a test pattern signal when the flow control operation is carried out by the modem device, and a stop bit detecting unit for outputting a stop bit detecting signal by detecting a stop bit in the test pattern signal transmitted by the test pattern transmitting unit, wherein the test pattern synchronizing clock signal controls a transmission/stop operation of the test pattern signal on the basis of the stop bit detecting signal outputted from the stop bit detecting unit and the control code detecting signal outputted from the control code detecting unit.

According to the above-described bit error measuring device, the control code detecting unit outputs a control code detecting signal by detecting a flow control code set in an input signal inputted thereinto from the modem device, masks the flow control code set in the input signal, and outputs the input signal of which the flow control code is masked. The bit error measuring unit measures bit errors in the input signal of which the flow control code is masked. The clock controlling unit outputs a test pattern synchronizing clock signal for controlling a transmission/stop operation of the test pattern signal on the basis of the stop bit detecting signal outputted from the stop bit detecting unit and the control code detecting signal outputted from the control code detecting unit. The test pattern transmitting unit transmits a test pattern signal when the flow control operation is carried out by the modem device. The stop bit detecting unit outputs a stop bit detecting signal by detecting a stop bit in the test pattern signal transmitted by the test pattern transmitting unit.

Thereby, error bits are not transmitted to the units to which the test pattern signal is transmitted. Further, the test pattern signal can be stopped in accordance with the state of the stop bit, and can be transmitted by synchronizing with the synchronizing clock. The bit error measuring unit can avoid judging that the flow control codes are bit errors, and the bit error measuring device for a modem device, which can carry out the flow control can be provided. As a result, the present invention can provide a high performance and high reliability bit error measuring device.

The clock controlling unit may comprise;

a start judging unit for outputting a start bit judging signal by judging that a start bit is detected in the control code detecting signal outputted from the control code detecting unit on the basis of a basic clock signal for setting a timing of each transmission/stop operation of the test pattern signal, and a stop judging unit for stopping the test pattern transmitting unit from transmitting the test pattern signal on the basis of the stop bit detecting signal outputted from the stop bit detecting unit and the control code detecting signal outputted from the control code detecting unit, and for controlling the test pattern synchronizing clock signal so as to retransmit the test pattern signal by the test pattern transmitting unit on the basis of the start judging signal outputted from the start judging unit.

In accordance with another aspect of the present invention, the bit error measuring device for modem method, for measuring bit errors when a flow control operation is carried out, comprises the steps of;

outputting a control code detecting signal by detecting a flow control code set in an input signal inputted from the modem device, masking the flow control code set in the input signal and outputting the input signal of which the flow control code is masked, measuring bit errors in the input signal of which the flow control code is masked, controlling a transmission/stop operation of a test pattern signal by generating a test pattern synchronizing clock signal on the basis of a stop bit detecting signal and the control code detecting signal, transmitting the test pattern signal when the flow control operation is carried out by the modem device, and generating the stop bit detecting signal by detecting a stop bit in the test pattern signal.

According to the above-described bit error measuring method, a control code detecting signal is outputted by detecting a flow control code set in an input signal inputted from the modem device. A flow control code set in the input signal is masked. An input signal of which the flow control code is masked, is outputted. The bit errors are measured in the input signal of which the flow control code is masked. A transmission/stop operation of the test pattern signal is controlled by generating a test pattern synchronizing clock signal on the basis of the stop bit detecting signal and the control code detecting signal. A test pattern signal is transmitted when the flow control operation is carried out by the modem device. A stop bit detecting signal is generated by detecting a stop bit in the test pattern signal.

Thereby, error bits are not transmitted to the units to which the test pattern signal is transmitted. Further, the test pattern signal can be stopped in accordance with the state of the stop bit, and can be transmitted by synchronizing with the synchronizing clock. The bit error measuring circuit can avoid judging that the flow control codes are bit errors, and the bit error measuring device for a modem device, which can carry out the flow control can be provided. As a result, the present invention can provide a high performance and high reliability bit error measuring device.

The step of controlling the transmission/stop operation may comprise the steps of;

outputting a start bit judging signal by judging that a start bit is detected in the control code detecting signal on the basis of a basic clock signal for setting a timing of each transmission/stop operation of the test pattern signal, and stopping a transmission of the test pattern signal on the basis of the stop bit detecting signal and the control code detecting signal, and controlling the test pattern synchronizing clock signal so as to retransmit the test pattern signal on the basis of the start judging signal.

In accordance with another aspect of the present invention, the bit error measuring device for modem device, comprises;

a control code detecting unit for detecting a flow control code set in an input signal from the modem device, and for masking the flow control code, a bit error measuring unit for measuring bit errors in the input signal of which the flow control code is masked, a clock controlling unit for controlling an output of a clock signal by the flow control code, and a test pattern transmitting unit for transmitting a test pattern signal by synchronizing with the clock signal when clock pulses of the clock signal are outputted from the clock signal controlling unit, and for stopping a transmission of the test pattern signal when the clock pulses of the clock signal are not outputted from the clock signal controlling unit.

In accordance with another aspect of the present invention, the bit error measuring method for modem device, comprises the steps of;

detecting a flow control code set in an input signal from the modem device, masking the flow control code, measuring bit errors in the input signal of which the flow control code is masked, controlling an output of a clock signal by the flow control code, and transmitting a test pattern signal by synchronizing with the clock signal when clock pulses of the clock signal are outputted, and stopping a transmission of the test pattern signal when the clock pulses of the clock signal are not outputted.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIG. 3A is a time chart showing the operation of stopping the clock pulses of the test pattern synchronizing signal;

FIG. 3B is a time chart showing the operation of retransmitting the clock pulses of the test pattern synchronizing signal;

PREFERRED EMBODIMENT OF THE INVENTION

Hereinafter, an embodiment of the bit error measuring device for a modem device and bit error measuring method for the same according to the present invention will be explained in detail with reference to the attached drawings.

Figure 1:
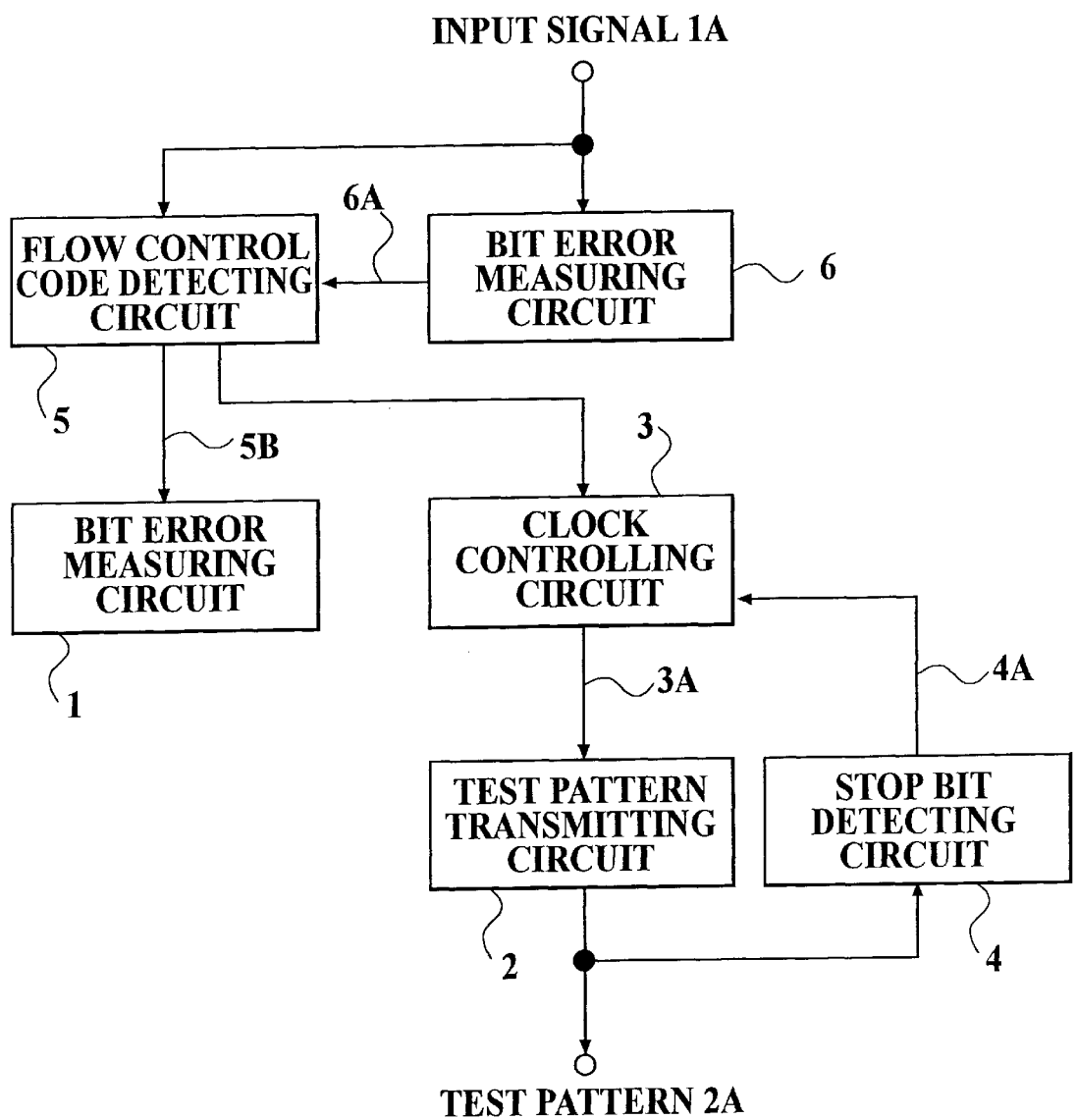
FIG. 1 is a block diagram showing a circuit construction of an embodiment of bit error measuring device according to the present invention.
Figure 2:
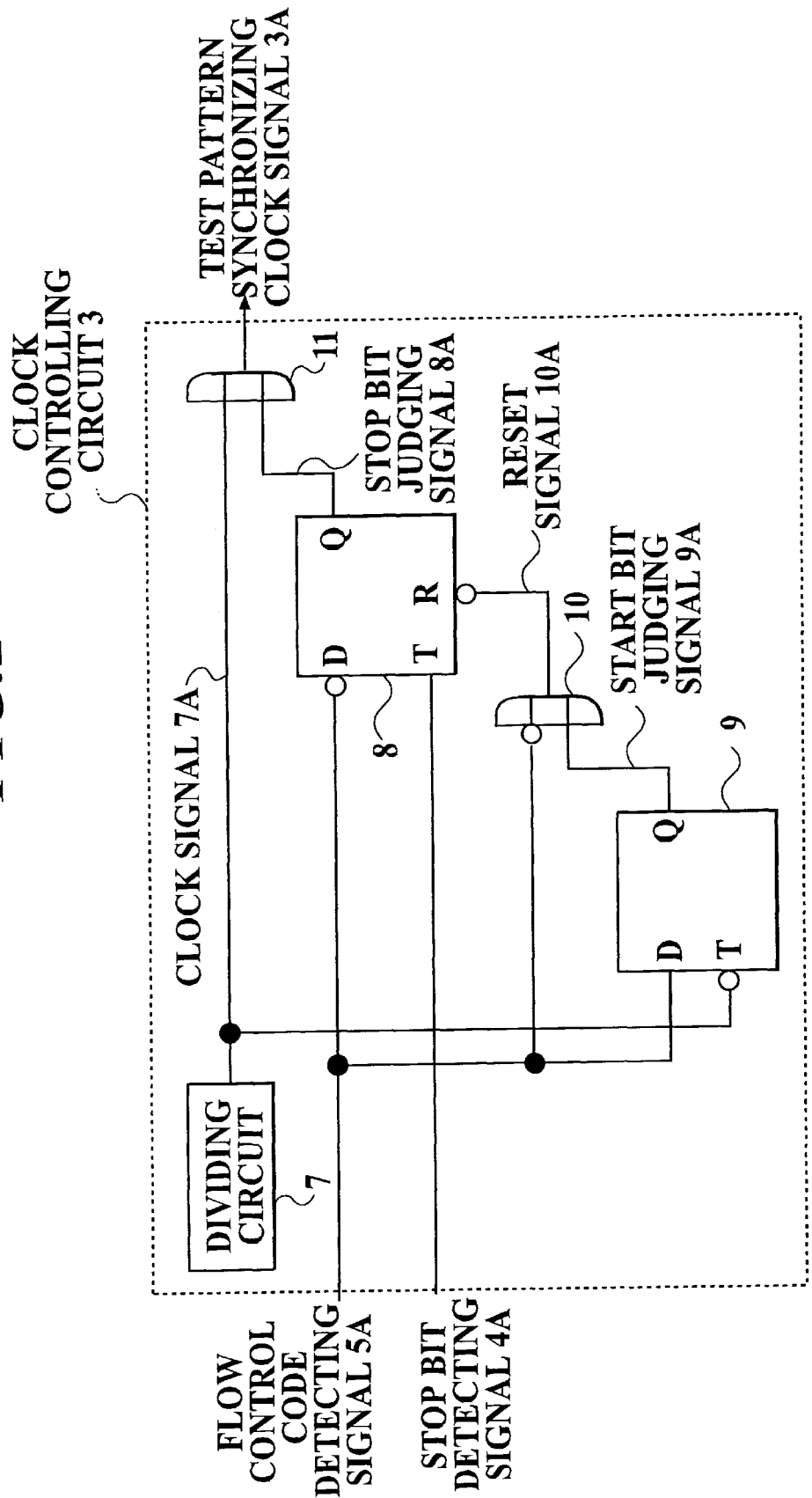
FIG. 2 is a block diagram showing a circuit construction of the clock controlling circuit shown in FIG. 1.
Figure 4:
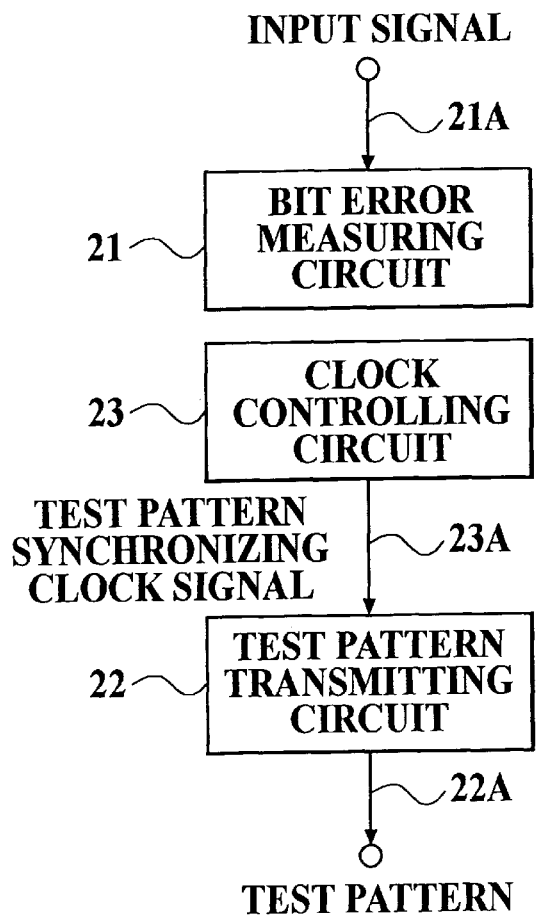
FIG. 4 is a block diagram showing a circuit construction of a bit error measuring device according to the earlier development.
Figure 5:
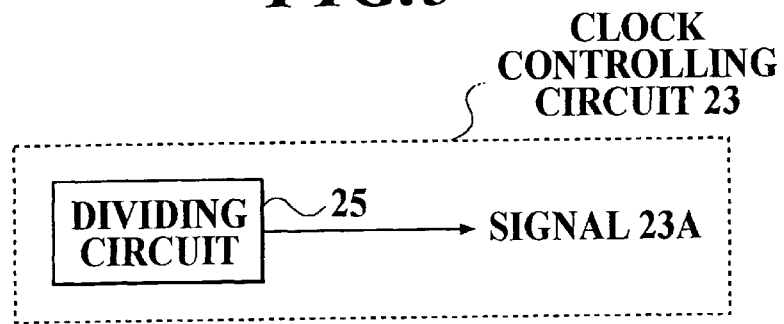
FIG. 5 is a block diagram showing a circuit construction of the clock controlling circuit shown in FIG. 4.

FIGS. 1 to 3 show an embodiment of the bit error measuring device for a modem device according to the present invention.

First, the construction of the bit error measuring device will be explained.

FIG. 1 is a block diagram showing a circuit construction of an embodiment of bit error measuring device. In FIG. 1, the bit error measuring device comprises a bit error measuring circuit 1, a test pattern transmitting circuit 2, a clock controlling circuit 3, a stop bit detecting circuit 4, a flow control code detecting circuit 5 and a bit error detecting circuit 6.

The bit error measuring circuit 1 measures (or detects) a bit error in an input signal 1A by using a signal 5B for measuring a bit error. The input signal 1A which is a pseudo-random pattern recommended by International Telecommunications Union-Telecommunication (hereinafter, referred as to ITU-T), is outputted from a modem device (not shown in the figure) and is inputted into the flow control code detecting circuit 5. At this time, flow control codes set in the signal 1A are masked by the flow control code detecting circuit 5 so as to generate the signal 5B and to output it to the bit error measuring circuit 1. The test pattern transmitting circuit 2 outputs a test pattern signal 2A which is a random code recommended by ITU-T, to the outside of the bit error measuring device and to the stop bit detecting circuit 4 by synchronizing it with a test pattern synchronizing clock signal 3A outputted from the clock controlling circuit 3.

As shown in FIG. 2, the clock controlling circuit 3 comprises a dividing circuit 7, a stop judging circuit 8, a start judging circuit 9 and gate circuits 10 and 11.

The dividing circuit 7 generates a clock signal 7A by dividing a basic clock signal in order to output it to the start judging circuit 9 and the gate circuit 11. The stop judging circuit 8 judges whether a D3 code (a test pattern stopping request code) is detected or not in a flow control code detecting signal 5A inputted into an inverting input terminal thereof from the flow control code detecting circuit 5, on the basis of a stop bit detecting signal 4A inputted into a non-inverting input terminal thereof from the stop bit detecting circuit 4. The stop judging circuit 8 outputs a stop bit judging signal 8A to the gate circuit 11 in order to send out the result of the above judgment. Further, the stop judging circuit 8 resets a setting state of the stop judging signal 8A by a reset signal 10A inputted into a reset terminal thereof from the gate circuit 10 in order to restart a clock operation of the test pattern synchronizing circuit 3A (in order to output clock pulses of the test pattern synchronizing circuit 3A outputted from the stop judging circuit 10 again).

The start judging circuit 9 judges whether a D1 code (a test pattern transmitting request code) is detected or not in a flow control code detecting signal 5A inputted into a non-inverting input terminal thereof from the flow control code detecting circuit 5, on the basis of the clock signal 7A inputted into an inverting input terminal thereof from the dividing circuit 7. Further, the start judging circuit 9 outputs a start bit judging signal 9A to the gate circuit 10 in order to send out the result of the above judgment.

The gate circuit 10 carries out an OR operation of two signals which are the flow control code detecting signal 5A inputted into an inverting input terminal thereof from the flow control code detecting signal 5A and the start bit judging signal 9A inputted into a non-inverting input terminal thereof from the start judging circuit 9. Further, the gate circuit 10 outputs a reset signal 10A (which is an active "High" signal) for setting or resetting the stop bit judging signal 8A outputted from the stop judging circuit 8, to a reset terminal "R" of the stop judging circuit 8

The gate circuit 11 carries out an OR operation of two signals which are the clock signal 7A outputted from the dividing circuit 7 and the stop judging signal 8A outputted from the stop judging circuit 8 in order to transmit or to stop the test pattern synchronizing clock signal 3A.

Therefore, In the clock controlling circuit 3, the operation of transmitting or stopping the test pattern synchronizing clock signal 3A is controlled by the flow control detecting signal 5A outputted from the flow control code detecting circuit 5 and by synchronizing with the stop bit detecting signal 4A outputted from the stop bit detecting circuit. As a result, the operation of transmitting or stopping the test pattern signal 2A to be outputted from the test pattern transmitting circuit 2 can be controlled by synchronizing with the stop bit.

The stop bit detecting circuit 4 detects the stop bit in the test pattern signal 2A outputted from the test pattern transmitting circuit 2. Further, the stop bit detecting circuit 4 outputs the stop bit detecting signal 4A to the clock controlling circuit 3 in order to send the result of the above detection.

The flow control code detecting circuit 5 comprises a buffer for storing one datum of the input signal 1A outputted from the modem device (not shown in the figures) in order to detect a flow control code in the stored input signal 1A and a bit error detecting signal 6A outputted from the bit error detecting circuit 6. The flow control code detecting circuit 5 outputs a flow control code detecting signal 5A to the clock controlling circuit 3 in order to sent the result of the above detection. Further, the flow control code detecting circuit 5 outputs the signal 5B for measuring a bit error, which is generated by masking a flow control code of the input signal 1A stored by the buffer, to the bit error measuring circuit 1.

The bit error detecting circuit 6 detects a bit error in the input signal 1A outputted from the modem device (not shown in the figures). Further, the bit error detecting circuit 6 outputs the bit error detecting signal 6A to the flow control detecting circuit 5 in order to send the result of the above detection.

Next, the operation of the above embodiment will be explained.

The operations of the bit error measuring device shown in FIG. 1 and the clock controlling circuit 3 shown in FIG. 2 will be explained with reference to time charts of each signal, which are shown in FIGS. 3A and 3B.

FIG. 3A is a time chart showing the operation of stopping a clock operation of the test pattern synchronizing signal 3A (or the operation of stopping clock pulses of the test pattern synchronizing signal 3A). In FIG. 3A, signal 1A denotes an input signal inputted into the bit error measuring device from an external modem device (not shown in the figures), signal 6A denotes a bit error detecting signal outputted from the bit error detecting circuit 6 shown in FIG. 1, signal 5A denotes a flow control code detecting signal outputted from the flow control code detecting circuit 5 shown in FIG. 1, signal 4A denotes a stop bit detecting signal outputted from the stop bit detecting circuit 4 shown in FIG. 1, signal 5B denotes a signal for measuring a bit error, which is outputted from the flow control code detecting circuit 5 shown in FIG. 1, signal 10A denotes a reset signal outputted from the gate circuit 10 shown in FIG. 2, signal 8A denotes a stop judging signal outputted from the stop judging circuit 8 shown in FIG. 2, signal 7A denotes a clock signal outputted from the dividing circuit 7 shown in FIG. 2, signal 3A denotes a test pattern synchronizing clock signal outputted from the clock controlling circuit 3 shown in FIG. 1, and signal 2A denotes a test pattern signal outputted from the test pattern transmitting circuit 2 shown in FIG. 1.

Further, FIG. 3B is a time chart showing the operation of restarting a clock operation of the test pattern synchronizing signal 3A (the operation of outputting clock pulses of the test pattern synchronizing signal 3A again). FIG. 3B shows the same signals as those shown in FIG. 3A.

The operation of stopping the clock pulses of the test pattern synchronizing signal 3A will be explained with reference to FIG. 3A.

In FIG. 3, the input signal 1A outputted from the external modem device, comprises a start bit (which is denoted by the reference numeral (3)), data bits (which are denoted by the reference numeral (4)), and a stop bit (which is denoted by the reference numeral (5)). These bits (3), (4) and (5) are repeatedly Inputted into the bit error measuring device. The reference numeral (1) described in the signal 1A shown in FIG. 3A, denotes a D3 code (13HEX (hexadecimal code)) which is a test pattern stopping request code in the flow control codes. Because the D3 code is set in the position of the input signal 1A, in which the data bits (4) are normally set, it is necessary that the flow control code detecting circuit 5 should check the input signal 1A with the bit error detecting signal 6A in order to detecting the D3 code.

That is, in the flow control code detecting circuit 5, the input signal 1A outputted from the external modem device is checked with the bit error detecting signal 6A outputted from the bit error detecting circuit 6. As shown in the bits (1) of the input signal 1A, when a "High" bit (an error bit) exists in the data bits, the flow control code detecting circuit 5 judges that the data are not normal data bits but a flow control code. When a "High" bit does not exist, the flow control code detecting circuit 5 judges that the data are normal data bits.

Therefore, when the flow control code detecting circuit 5 detects that the D3 code was set in the input signal 1A, the flow control code detecting signal 5A shown in FIG. 3A is outputted to the clock controlling circuit 3 as a "Low" level signal in order to request the test pattern synchronizing clock signal 3A to stop.

Further, the flow control code detecting circuit 5 stores one datum (4) of the input signal 1A outputted from the modem device by using a buffer. When the flow control code, such as a D3 code, is set, the flow control code is masked by a "High" level signal. As shown in FIG. 3A, the masked signal is outputted to the bit error measuring circuit 1 as a signal 5B for measuring a bit error.

When one datum of the signal 5B for measuring a bit error is inputted into the bit error measuring circuit 1 from the flow control code detecting circuit 5, the bit error measuring circuit 1 counts the bit errors thereof. On the other hand, when the masked flow control code of the signal 5B for measuring a bit error is inputted into the bit error measuring circuit 1 from the flow control code detecting circuit 5, the stop bit (5) is detected by the bit error measuring circuit 1. As a result, the bit error measuring circuit 1 does not count the bit errors.

When the flow control code detecting circuit 5 outputs the flow control code detecting circuit 5A as a "Low" level signal in order to request the test pattern synchronizing clock signal 3A to stop, in the clock controlling circuit 3, the stop judging circuit 8 inverts the stop bit judging signal 8A in order to output a "High" level signal to the gate circuit 11 at the time that the voltage of the stop bit detecting signal 4A outputted from the stop bit detecting circuit 4 rises. As a result, the test pattern synchronizing clock signal 3A shown in FIG. 3A keeps "High" and the clock pulses thereof are stopped.

That is, at this time, the reset signal 10A outputted from the gate circuit 10 is inputted into the reset terminal of the stop judging circuit 8. When the flow control code detecting signal 5A is a "Low" level signal, the reset signal 10A is a "High" level signal in order to set the stop judging circuit 8. At the time that the voltage of the stop bit detecting signal 4A rises, the stop bit judging signal 8A shown in FIG. 3A is a "High" level signal. As a result, the clock pulses of the test pattern synchronizing clock signal 3A are stopped by synchronizing with the stop bit.

The operation of retransmitting the clock pulses of the test pattern synchronizing signal 3A will be explained with reference to FIG. 3B.

In the input signal 1A shown in FIG. 3B, which is outputted from the external modem device, data bits (2) are a D1 code (11HEX) which is a test pattern transmitting request code in the flow control codes. Because the D1 code exists in the position of the input signal 1A, in which the data bits are normally set, the flow control code detecting circuit 5 detects and masks the D1 code in the same way as the D3 code. When the D1 code is detected by the flow control code detecting circuit 5, the flow control code detecting signal 5A is inverted into a "High" level signal as shown in FIG. 3B. The start bit judging signal 9A outputted from the start judging circuit 9 is inverted into a "Low" level signal at the time that the voltage of the clock signal 7A outputted from the dividing circuit 7 drops. The reset signal 10A outputted from the gate circuit 10 is inverted into a "Low" level signal in order to reset the stop judging circuit 8. When the stop judging signal 8A is a "Low" level signal, the clock pulses of the test pattern synchronizing clock signal 3A are outputted by the gate circuit 11 again. As a result, the test pattern signal 2A is retransmitted by the test pattern synchronizing clock signal 3A.

As described above, in the bit error measuring device according to the present invention, the flow control codes (a D1 code and a D3 code) set in the data bits by the modem device are detected by the flow control code detecting circuit 5. When the stop bit of the test pattern signal 2A is detected by the stop bit detecting circuit 4 and the D3 code which is a test pattern stopping request code is detected by the clock controlling circuit 3, the clock controlling circuit 3 stops outputting the clock pulses of the test pattern synchronizing clock signal 3A by synchronizing with the detected stop bit in order to stop transmitting the test pattern signal 2A. As a result, error bits are not transmitted to the units to which the test pattern signal 2A is transmitted. Further, the test pattern signal 2A can be stopped in accordance with the state of the stop bit, and can be transmitted by synchronizing with the synchronizing clock.

Because the flow control code detecting circuit 5 masks the flow control codes set in the input signal 1A in order to output the signal 5B for measuring a bit error to the bit error measuring circuit 1, the bit error measuring circuit 1 can avoid judging that the flow control codes are bit errors, and the bit error measuring device for a modem device, which can carry out the flow control can be provided. As a result, the present invention can provide a high performance and high reliability bit error measuring device.

In the clock controlling circuit, the operation of stopping or retransmitting the clock signal may be directly controlled by the flow control codes outputted from the modem device.

Further, the present invention can be applied to a test pattern transmitting device for transmitting or stopping a test pattern by receiving the flow control codes outputted from the outside thereof.

The entire disclosure of Japanese Patent Application No. Tokugan-Hei 9-324894 filed on Nov. 26, 1997 including specification, claims drawings and summary are incorporated herein by reference in its entirety.

What is claimed is:

1. A bit error measuring device for modem device, for measuring bit errors when a flow control operation is carried out, comprising;

a control code detecting unit for outputting a control code detecting signal by detecting a flow control code set in an input signal inputted thereinto from the modem device, and for masking the flow control code set in the input signal and outputting the input signal of which the flow control code is masked, a bit error measuring unit for measuring bit errors in the input signal of which the flow control code is masked, a clock controlling unit for outputting a test pattern synchronizing clock signal to a test pattern transmitting unit, the test pattern transmitting unit for transmitting a test pattern signal when the flow control operation is carried out by the modem device, and a stop bit detecting unit for outputting a stop bit detecting signal by detecting a stop bit in the test pattern signal transmitted by the test pattern transmitting unit, wherein the test pattern synchronizing clock signal controls a transmission/stop operation of the test pattern signal on the basis of the stop bit detecting signal outputted from the stop bit detecting unit and the control code detecting signal outputted from the control code detecting unit.

2. A bit error measuring device for modem device as claimed in claim 1; wherein the clock controlling unit comprises;

a start judging unit for outputting a start bit judging signal by judging that a start bit is detected in the control code detecting signal outputted from the control code detecting unit on the basis of a basic clock signal for setting a timing of each transmission/stop operation of the test pattern signal, and a stop judging unit for stopping the test pattern transmitting unit from transmitting the test pattern signal on the basis of the stop bit detecting signal outputted from the stop bit detecting unit and the control code detecting signal outputted from the control code detecting unit, and for controlling the test pattern synchronizing clock signal so as to retransmit the test pattern signal by the test pattern transmitting unit on the basis of the start judging signal outputted from the start judging unit.

3. A bit error measuring device for modem method, for measuring bit errors when a flow control operation is carried out, comprising the steps of;

outputting a control code detecting signal by detecting a flow control code set in an input signal inputted from the modem device, masking the flow control code set in the input signal and outputting the input signal of which the flow control code is masked, measuring bit errors in the input signal of which the flow control code is masked, controlling a transmission/stop operation of a test pattern signal by generating a test pattern synchronizing clock signal on the basis of a stop bit detecting signal and the control code detecting signal, transmitting the test pattern signal when the flow control operation is carried out by the modem device, and generating the stop bit detecting signal by detecting a stop bit in the test pattern signal.

4. A bit error measuring method for modem device as claimed in claim 3; wherein the step of controlling the transmission/stop operation comprises the steps of;

outputting a start bit judging signal by judging that a start bit is detected in the control code detecting signal on the basis of a basic clock signal for setting a timing of each transmission/stop operation of the test pattern signal, and stopping a transmission of the test pattern signal on the basis of the stop bit detecting signal and the control code detecting signal, and controlling the test pattern synchronizing clock signal so as to retransmit the test pattern signal on the basis of the start judging signal.

5. A bit error measuring device for modem device, comprising;

a control code detecting unit for detecting a flow control code set in an input signal from the modem device, and for masking the flow control code, a bit error measuring unit for measuring bit errors in the input signal of which the flow control code is masked, a clock controlling unit for controlling an output of a clock signal by the flow control code, and a test pattern transmitting unit for transmitting a test pattern signal by synchronizing with the clock signal when clock pulses of the clock signal are outputted from the clock signal controlling unit, and for stopping a transmission of the test pattern signal when the clock pulses of the clock signal are not outputted from the clock signal controlling unit.

6. A bit error measuring device for modem device as claimed in claim 5, further comprising;

a stop bit detecting unit for detecting a stop bit in the test pattern signal and for outputting a stop bit detecting signal to the clock controlling circuit in order to stop outputting the clock pulses of the clock signal.

7. A bit error measuring method for modem device, comprising the steps of;

detecting a flow control code set in an input signal from the modem device, masking the flow control code, measuring bit errors in the input signal of which the flow control code is masked, controlling an output of a clock signal by the flow control code, and transmitting a test pattern signal by synchronizing with the clock signal when clock pulses of the clock signal are outputted, and stopping a transmission of the test pattern signal when the clock pulses of the clock signal are not outputted.

8. A bit error measuring device for modem method as claimed in claim 7, further comprising the step of;

detecting a stop bit in the test pattern signal and outputting a stop bit detecting signal in order to stop outputting the clock pulses of the clock signal.

* * * * *